United States Patent
Sekiguchi et al.

[11] Patent Number: 5,780,908
[45] Date of Patent: Jul. 14, 1998

[54] SEMICONDUCTOR APPARATUS WITH TUNGSTEIN NITRIDE

[75] Inventors: Mitsuru Sekiguchi, Kyoto; Michinari Yamanaka, Osaka, both of Japan

[73] Assignee: Matsushita Electric Industrial Co., Ltd., Osaka, Japan

[21] Appl. No.: 751,810

[22] Filed: Nov. 19, 1996

Related U.S. Application Data

[62] Division of Ser. No. 646,535, May 8, 1996.

[30] Foreign Application Priority Data

May 9, 1995 [JP] Japan .................................... 7-110433
Aug. 3, 1995 [JP] Japan .................................... 7-198502

[51] Int. Cl.$^6$ ........................................ H01L 23/02
[52] U.S. Cl. .................... 257/383; 257/412; 257/751; 257/763; 257/924
[58] Field of Search ........................ 257/924, 751, 257/412, 382, 383, 763, 767, 770

[56] References Cited

U.S. PATENT DOCUMENTS

| | | | |
|---|---|---|---|
| 4,829,363 | 5/1989 | Thomas et al. | 357/71 |
| 5,350,711 | 9/1994 | Hall | 437/192 |
| 5,414,301 | 5/1995 | Thomas | 257/740 |
| 5,440,174 | 8/1995 | Nishitsuji | 257/770 |
| 5,561,326 | 10/1996 | Ito et al. | 257/751 |
| 5,589,712 | 12/1996 | Kawashima et al. | 257/924 X |
| 5,592,024 | 1/1997 | Aoyamo et al. | 257/751 |
| 5,623,157 | 4/1997 | Miyazaki et al. | 257/751 X |

FOREIGN PATENT DOCUMENTS

| | | | |
|---|---|---|---|
| 363216334 A | 9/1988 | Japan | 257/751 |
| 406005604 A | 1/1994 | Japan | 257/751 |

*Primary Examiner*—William Mintel
*Attorney, Agent, or Firm*—McDermott, Will & Emery

[57] ABSTRACT

Through exposure of the top surface of a tungsten film to plasma of a gas including nitrogen at a temperature of 550° C. or less, a tungsten nitride layer having a structure in which nitrogen atoms and tungsten atoms are bonded is formed in an area in the vicinity of the surface of the tungsten film. Then, an aluminum alloy film is deposited on the tungsten film, thereby forming a metallic interconnection. Since the nitrogen atoms and the tungsten atoms are bonded in the tungsten nitride layer formed by such plasma nitridation, the tungsten nitric layer not only has a good barrier function to prevent the diffusion of other metal atoms but also can be formed in a small thickness. Accordingly, formation of an alloy layer with a high resistance otherwise caused due to counter diffusion during an annealing process and a junction leakage can be avoided.

8 Claims, 14 Drawing Sheets

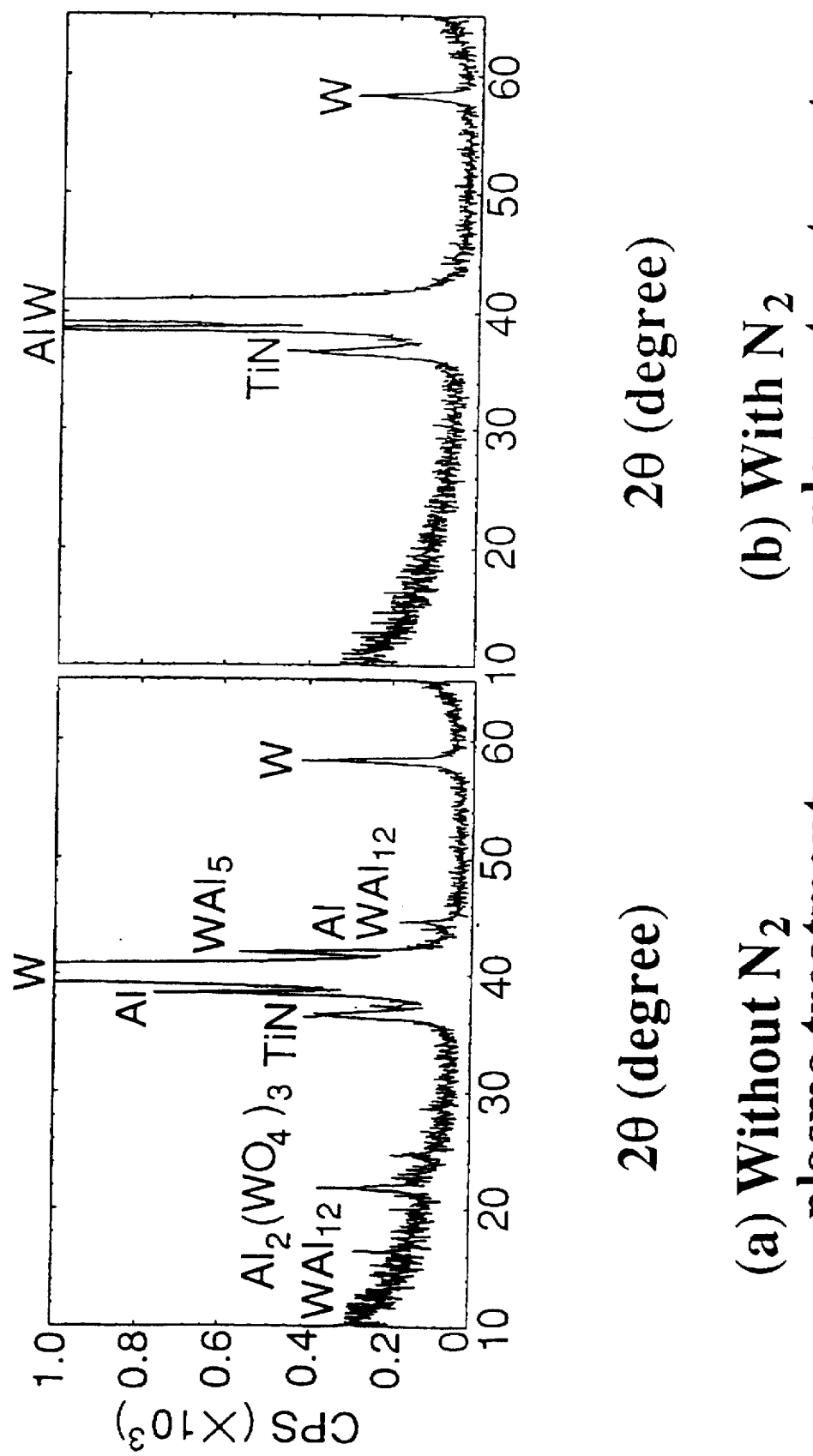

SEMICONDUCTOR APPARATUS WITH TUNGSTEIN NITRIDE

This is a divisional of application Ser. No. 08/646,535, filed May 8, 1996.

BACKGROUND OF THE INVENTION

The present invention relates to a semiconductor apparatus comprising a refractory metal, used as interconnections and electrodes for the production of a VLSI, and a metallic interconnection formed thereon, and a production method for the semiconductor apparatus.

As VLSIs have recently been developed to be more highly integrated and have a higher density, Al/W bilayer interconnection has been earnestly studied (for example, H. Yamaguchi, et al., Proc. Int. VMIC, 393–395, 1993). In the formation of metallic interconnection by using the Al/W bilayer interconnection, chemical vapor deposition (hereinafter referred to as the CVD), which is excellent in the coating property, is adopted to deposit tungsten on the entire surface of a substrate (which process is hereinafter referred to as the blanket tungsten CVD). On the deposited tungsten is deposited an aluminum alloy film to decrease the resistance of the interconnection, and then, both the tungsten and the aluminum alloy film are made into a pattern, so as to form the metallic interconnection.

Now, the conventionally proposed method of forming the AL/W bilayer interconnection will be described referring to FIGS. 12(a) through 12(d).

In the procedure shown in FIG. 12(a), a first insulating film 2 is deposited on a silicon substrate 1 bearing a semiconductor device such as a transistor. On the first insulating film 2 is deposited a titanium/titanium nitride bilayer film 3a as an adhesion layer for tungsten by a sputtering method. On the titanium/titanium nitride bilayer film 3a is deposited a tungsten film 3b by the blanket tungsten CVD. At this point, the films 3a and 3b are formed so as to bury a contact hole shown with broken lines in FIG. 12(a).

Then, as is shown in FIG. 12(b), an aluminum alloy film 3c including silicon (approximately 1%) and copper (approximately 0.5%) is deposited on the tungsten film 3b by the sputtering method. On the aluminum alloy film 3c is deposited a titanium nitride film 3d so as to ease the formation of an interconnection pattern in the subsequent photolithography. At this point, the aluminum alloy film 3c functions to decrease the resistance of the interconnection, and the titanium nitride film 3d functions to decrease the reflectance thereof at a wavelength of exposing light.

Next, as is shown in FIG. 12(c), the titanium/titanium nitride bilayer film 3a, the tungsten film 3b, the aluminum alloy film 3c and the titanium nitride film 3d are made into a desired pattern by the photolithography and dry etching, thereby forming a first metallic interconnection 3.

Then, as is shown in FIG. 12(d), the resultant semiconductor apparatus is placed in annealing equipment 9 to be subjected to annealing at a temperature of 450° C. This annealing is conducted in order to recover a damage of groundwork caused by the dry etching and stabilize the interface between the metals. When the metals for the interconnection include aluminum as described above, the annealing is generally conducted at a temperature of approximately 450° C. in order to retain the thermal stability of aluminum. It is generally considered that a temperature of 450° C. or more is preferred for the recovery of a dry etching damage and removal of water contents from the insulating film.

With regard to the contact hole for connecting upper and lower metallic interconnection layers, when a film is formed within a fine contact hole having a diameter of 0.8 µm or less by a conventional sputtering method, the formed film lacks for step coverage, resulting in insufficient reliability under application of a current. Therefore, it is necessary to adopt a method of forming a buried plug with good step coverage.

As an example of the method of forming a buried plug, tungsten is deposited on the entire top surface of a semiconductor substrate by the CVD, and unnecessary tungsten excluding that deposited within a contact hole is removed by etching (which process is designated as the etch back), so as to bury the contact hole alone in tungsten. When this method is adopted, an aluminum alloy film is thereafter deposited on the buried plug and an interlayer insulating film, and the aluminum alloy film is made into a pattern by the photolithography so as to form a metallic interconnection. In this case, the tungsten is in contact with the aluminum alloy on the contact hole.

Now, procedures for burying a via in a metal by a conventional buried plug method will be described referring to FIGS. 13(a) through 13(d).

As is shown in FIG. 13(a), a first insulating film 2 and a first metallic interconnection 3 are formed on a silicon substrate 1 bearing a semiconductor device such as a transistor. On the first metallic interconnection 3 is formed a second insulating film 4 of a silicon oxide film by, for example, plasma CVD. Then, a contact hole 5 is formed at a desired position on the second insulating film 4 by the dry etching so as to reach the first metallic interconnection 3.

Next, a titanium/titanium nitride bilayer film 6 serving as an adhesion layer for tungsten is deposited within the contact hole 5 and on the second insulating film 4 by the sputtering method. On the titanium/titanium nitride bilayer film 6 is deposited a tungsten film 7 by the blanket tungsten CVD.

Then as is shown in FIG. 13(b), the tungsten film 7 and the titanium/titanium nitride bilayer film 6 on the second insulating film 4 are subjected to the etch back by the dry etching, so as to have the tungsten film 7 and the titanium/titanium nitride bilayer film 6 remained within the contact hole 5 alone. Thereafter, an aluminum alloy film 8a including silicon (approximately 1%) and copper (approximately 0.5%) and a titanium nitride film 8b are successively deposited thereon by the sputtering method. The aluminum alloy film 8a functions to decrease the resistance of the interconnection, and the titanium nitride film 8b functions to decrease the reflectance thereof at a wavelength of exposing light.

Next, as is shown in FIG. 13(c), the aluminum alloy film 8a and the titanium nitride film 8b are made into a desired pattern by the photolithography and the dry etching, thereby forming a second metallic interconnection 8.

Then, as is shown in FIG. 13(d), the resultant semiconductor apparatus is placed in annealing equipment 9, so as to be subjected to annealing in the same manner as described referring to FIG. 12(d).

Furthermore, for the purpose of decreasing a sheet resistance of a source/drain region and a gate electrode of a MOS semiconductor apparatus to attain a higher operation speed, selective formation of a tungsten film on the source/drain region and the gate electrode, that is, so-called tungsten adhesion technique, has recently been proposed (for example, M. Sekine, et al., Tech. Dig. IEDM, 493–496, 1994). In this technique, when a metallic interconnection of an aluminum alloy film is formed within a contact hole, the tungsten is in contact with the aluminum alloy below the contact hole.

Now, the procedures of the conventionally proposed tungsten adhesion technique will be described referring to FIGS. 14(a) through 14(d).

First, as is shown in FIG. 14(a), a source/drain region 12 and a gate electrode 13 made of polycrystal silicon of a MOS semiconductor apparatus are formed on a silicon substrate 1, and then, a tungsten film 7 is selectively formed on the gate electrode 13 and the source/drain region 12 by the CVD.

Next, as is shown in FIG. 14(b), a first insulating film 2 is formed on the resultant semiconductor apparatus, and a contact hole 5 is formed in the first insulating film 2.

Then, as is shown in FIG. 14(c), an Al alloy is deposited within the contact hole 5 and on the first insulating film 2 by, for example, sputtering the Al alloy at a temperature of 500° C., and the obtained Al alloy film is made into a pattern, thereby forming a first metallic interconnection 3 including a contact member within the contact hole 5.

Then, as is shown in FIG. 14(d), the semiconductor apparatus is placed in annealing equipment 9, where annealing is conducted in the same manner as described referring to FIG. 12(d).

However, in any of the procedures shown in FIGS. 12 through 14, there arise common problems as follows:

It has been found that, in the annealing process shown in FIGS. 12(d), 13(d) and 14(d), counter diffusion of tungsten and aluminum causes a reaction between the tungsten and the aluminum, so as to form an alloy of tungsten and aluminum (such as $WAl_{12}$). Since $WAl_{12}$ has a high resistance, the resistance of the interconnection can be undesirably increased and heat caused by a current flowing through the interconnection can disadvantageously disconnect the interconnection (for example, H. Yamaguchi, et al., Proc. Int. VMIC, 393–395, 1993).

Furthermore, in the case where the silicon substrate is present below the tungsten film as shown in FIGS. 14(a) through 14(d) and a PN junction is formed by diffusing an impurity in the silicon substrate, aluminum diffused due to the counter diffusion between the tungsten and the aluminum can punch through the PN junction. In such a case, a junction leakage can be undesirably caused.

These problems of the interconnection resistance and the junction leakage can similarly arise in adopting selective tungsten CVD in which tungsten is selectively deposited in a via or contact by the CVD.

In order to avoid the formation of the alloy layer of $WAl_{12}$, means for preventing the aluminum from being directly in contact with the tungsten is generally provided. For example, between the aluminum alloy film and the tungsten film, a titanium nitride film is interposed as a diffusion preventing film. However, the titanium nitride film is good at working as a barrier layer but has the following problems: The titanium nitride film is composed of needle-like crystals. In order to give the barrier function, it is necessary to oxidize the surface to stuff oxygen between the crystals. Oxidation is conducted by exposing the titanium nitride film to air, and hence, it is required to change the atmosphere in the chamber from substantial vacuum to air for the oxidation and to change it again to the substantial vacuum after the oxidation. Furthermore, since the number of film formation is increased, the production cost can be increased and the yield can be decreased due to generation of particles.

On the other hand, it is disclosed that a tungsten nitride layer with a thickness of approximately 3 nm can be formed by exposing a tungsten film to an $NH_3$ gas at a high temperature of 550° C. for a long period of time (Japanese Laid-Open Patent Publication No. 63-84154). In this method, however, the speed of forming the tungsten nitride layer is as low as 3 nm/60 min. In addition, an impurity in a source/drain region is absorbed by the tungsten through the annealing at a high temperature for a long period of time, so as to cause a reaction between the tungsten film and the silicon substrate. As a result, a junction leakage can be caused, thereby degrading the saturation current of the transistor.

Furthermore, as is disclosed in Japanese Laid-Open Patent Publication No. 7-231037, formation of a tungsten nitride film on a tungsten film by a reactive sputtering method is also known. However, according to the description of Japanese Laid-Open Patent Publication No. 7-231037, when the tungsten nitride layer formed at 500° C. in an atmosphere of the $NH_3$ gas, the composition of the nitrided layer is not homogenous, and the resistance value is largely increased after the annealing. This means that it is difficult to form a nitrided layer having a barrier function merely by exposing a tungsten film to the $NH_3$ gas at a temperature lower than 500° C.

On the other hand, although the tungsten nitride film formed by the reactive sputtering method has a sufficient function as a barrier layer, the resistance value of the entire bilayer film is large, and the resistance obtained when a current is allowed to flow in the vertical direction to the tungsten nitride layer, that is, the contact resistance of a buried layer in a contact hole, is large, and therefore, it is difficult to form a buried layer having small resistance. This is because, in addition to the high resistance of the tungsten nitride film itself, the tungsten nitride layer formed by the reactive sputtering method has a thickness of 20 through 200 nm because it must be continuously formed, and it is difficult to attain a small thickness of 20 nm or less.

SUMMARY OF THE INVENTION

The present inventors have made it clear that the structure of a tungsten nitride layer largely affects the function thereof as a barrier layer, and as a result, it has been found that a tungsten nitride layer formed via atomic bond between nitrogen atoms and tungsten atoms exhibits a good barrier function. The object of the invention is providing a semiconductor apparatus and a production method for the same in which the formation of a compound with a high resistance and the occurrence of a junction leakage are prevented by using means for forming a tungsten nitride layer in a thickness as small as possible so as to have a structure in which the nitrogen atoms and the tungsten atoms are bonded.

The semiconductor apparatus of this invention comprises a semiconductor substrate; a conductive layer formed on a part of the semiconductor substrate; a refractory metal film formed on the conductive layer; a nitrided metal layer formed in an area in the vicinity of a top surface of the refractory metal film and having a structure in which nitrogen atoms and refractory metal atoms are bonded; and a metallic interconnection formed on the refractory metal film with the nitrided metal layer interposed therebetween and made of a metal material reactive with the refractory metal.

In one aspect, the conductive layer is an active area formed by introducing an impurity into the semiconductor substrate, the semiconductor apparatus is further provided with an insulating film formed on the active area and a contact hole formed in a part of the insulating film so as to reach the active area, and the refractory metal film is buried in the contact hole In another aspect, the semiconductor apparatus further comprises a gate electrode formed on the semiconductor substrate. The conductive layer is a source/drain region formed by introducing an impurity into the semiconductor substrate so as to be positioned on both sides of the gate electrode, and the refractory metal film can be formed on the gate electrode and the source/drain region.

Owing to the aforementioned configuration, the nitrided metal layer, in which the nitrogen atoms and the tungsten atoms are bonded, is excellent in a function to prevent the diffusion of the metal atoms, namely has a good barrier function. Therefore, in the annealing process during the production of the semiconductor apparatus, the counter diffusion of the composing atoms between the refractory metal film and the metallic interconnection can be prevented. As a result, the resistances of an interconnection, a plug layer and the like can be prevented from being increased due to the counter diffusion of the composing atoms between the refractory metal film and the metallic interconnection, and a junction leakage is prevented from being caused by metal invasion of the semiconductor substrate.

Preferably, the nitrided metal layer has a thickness of 10 nm or less.

As a result, the nitrided metal layer having a high resistance value can be very thin, and hence, the resistances of the interconnection, the plug layer and the like can be made as small as possible.

Preferably, the content of nitrogen in a part of the nitrided metal layer is in a range where an amorphous nitrided metal layer is formed in a part of the nitrided metal layer.

As a result, the function to prevent the counter diffusion of the composing atoms between the refractory metal film and the metallic interconnection can be further enhanced.

Preferably, the content of nitrogen in a part of the nitrided metal layer is larger than a stoichiometric ratio of the nitriding metal.

As a result, the barrier function of the nitrided metal layer can be more remarkably exhibited.

The nitrided metal layer can be formed so as to have a substantially uniform thickness from the top surface of the refractory metal film.

As a result, even through the nitrided metal layer has a small thickness, the barrier function of the nitrided metal layer can be securely exhibited in the entire boundary between the refractory metal film and the metallic interconnection.

The nitrided metal layer can include oxygen.

As a result, the barrier function of the nitrided metal layer can be further enhanced.

The refractory metal can be tungsten.

As a result, while a tungsten film having good characteristics that it does not harmfully affect a semiconductor can be used as a buried plug layer and an electrode, the formation of an alloy layer between the tungsten film and the metallic interconnection can be securely avoided.

The metallic interconnection can be made of a metal material including aluminum.

As a result, even when the metallic interconnection includes aluminum, which has a low resistance but can form an alloy layer having a high resistance together with the refractory metal through the annealing process and can invade the semiconductor substrate so as to cause a junction leakage, the increase of the resistances of the interconnection, the plug layer and the like as well as the increase of the junction leakage can be securely prevented in the semiconductor apparatus.

The first production method for a semiconductor apparatus of this invention comprises a first step of forming a conductive layer on a part of a semiconductor substrate; a second step of depositing a refractory metal film on the conductive layer; a third step of emitting nitrogen ions onto a surface of the refractory metal film so as to form a nitrided metal layer, which has a structure in which nitrogen atoms and refractory metal atoms are bonded, in an area in the vicinity of the surface of the refractory metal film; a fourth step of depositing a metal film for interconnection on the refractory metal film after the third step; and a fifth step of forming a metallic interconnection by patterning the metal film for interconnection.

In one aspect, the production method can further comprise, after the first step and before the second step, a step of forming an insulating film on the conductive layer and a step of forming a contact hole in a part of the insulating film so as to reach the conductive layer. In the second step, the refractory metal film can be formed within the contact hole.

In another aspect, the production method can further comprise, before the first step, a step of forming a gate electrode on the semiconductor substrate. In the first step, a source/drain region serving as the conductive layer can be formed by introducing an impurity into the semiconductor substrate so as to be positioned on both sides of the gate electrode, and in the second step, the refractory metal film can be formed on the gate electrode and the source/drain region.

According to this method, when nitrogen ions in the plasmatic state enter the area in the vicinity of the top surface of the refractory metal film in the second step, the nitrogen atoms are substituted with the refractory metal atoms, thereby forming the nitrided metal layer having a structure in which the nitrogen atoms and the refractory metal atoms are bonded. Accordingly, even when the annealing process is thereafter conducted for the recovery of a damage caused by another process and for the stabilization of the films, the alloy layer having a high resistance can be prevented from being formed by the counter diffusion of the composing metals between the refractory metal film and the metallic interconnection, and the increase of a junction leakage can be avoided. As a result, it is possible to manufacture a semiconductor apparatus having excellent characteristics in which the resistances of an interconnection, the plug layer and the like are small.

The third step can be conducted by generating plasma in an atmosphere of a $N_2$ gas.

As a result, by using the $N_2$ gas, which conventionally has a difficulty in nitridation through annealing alone, the nitrided metal layer can be formed in a neutral atmosphere without harmfully affecting the characteristics of the semiconductor apparatus.

The third step can be conducted by generating plasma in an atmosphere of an $NH_3$ gas at a temperature of 550° C. or less.

The third step can be conducted by emitting at least one of UV and ionizing radiation in an atmosphere of a gas including nitrogen atoms onto the refractory metal film at a temperature of 550° C. or less.

The third step can be conducted by emitting an ion beam including nitrogen atoms onto the refractory metal film at a temperature of 550° C. or less.

In any of these methods, the nitrided metal layer can be formed so as to have a structure in which the nitrogen atoms and the refractory metal atoms are bonded, similarly to the plasma nitridation.

The third step can be conducted by CVD.

According to this method, even on the refractory metal film formed by the CVD and having rough morphology, the nitrided metal layer can be formed in a uniform and small thickness.

Preferably, the third step is conducted by using a plasma generation apparatus in which a positive electrode and a negative electrode are disposed parallel to each other and applying a negative potential to the semiconductor substrate.

Preferably, the third step is conducted with a potential difference between the positive electrode and the negative electrode retaining at 100 V or more.

As a result, the ratio of the atomic bond between the nitrogen atoms and the refractory metal atoms can be increased.

The second production method for a semiconductor apparatus of this invention comprises a first step of forming a conductive layer on a part of a semiconductor substrate; a second step of depositing a tungsten film on the conductive layer; a third step of depositing a metal film for interconnection made of a metal material including aluminum on the tungsten film; a fourth step of forming a metallic interconnection by patterning the metal film for interconnection; and a fifth step of conducting annealing at a temperature ranging between 400° C. and 430° C. after the fourth step, so as to recover a damage caused in the metal film for interconnection in the fourth sep.

Also according to this method, the alloy layer having a high resistance can be prevented from being formed by the counter diffusion between the tungsten and the aluminum through the annealing process for the recovery of the damage.

BRIEF DESCRIPTION OF THE DRAWINGS

FIGS. 9(a) and 9(b) are diagrams showing data of X-ray diffraction in samples with and without the $N_2$ plasma treatment;

DETAILED DESCRIPTION OF THE INVENTION (Embodiment 1)

A production method for a semiconductor apparatus according to the first embodiment will now be described referring to FIGS. 1(a) through 1(e).

Figure 1:
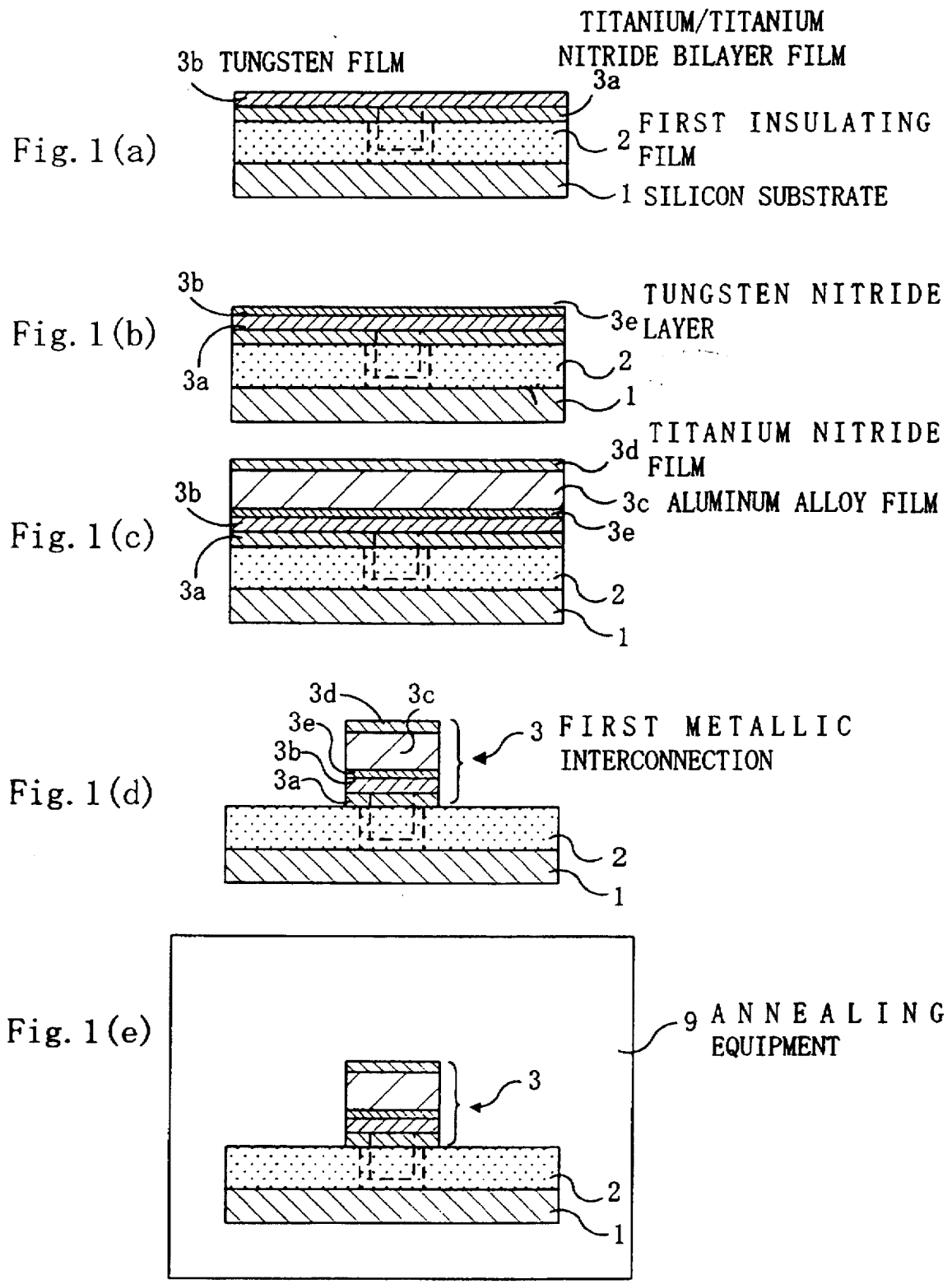
FIG. 1(a) through 1(e) are sectional views for showing production procedures for a semiconductor apparatus of a first embodiment.

In the procedure shown in FIG. 1(a), a first insulating film 2 of a silicon oxide film is deposited on a silicon substrate 1 on which a transistor and the like are previously formed. On the first insulating film 2, a bilayer film 3a including a titanium film (with a thickness of approximately 10 nm) and a titanium nitride film (with a thickness of approximately 30 nm) is deposited as an adhesion layer for tungsten by the sputtering method. On the bilayer film 3a, a tungsten film 3b with a thickness of approximately 130 nm is successively deposited by the blanket tungsten CVD. At this point, the films 3a and 3b are formed so as to bury a contact hole shown with broken lines in FIG. 1(a), and the thicknesses thereof depend upon the diameter (approximately 300 nm in this embodiment) and the depth of the contact hole.

Next, in the procedure shown in FIG. 1(b), the surface of the tungsten film 3b is exposed to plasma with RF (Radio Frequency) power of 300 W at a temperature of 50° C. in an atmosphere of 100% nitrogen gas at a pressure of 80 mTorr for one minute, thereby nitriding an area in the vicinity of the surface of the tungsten film 3b so as to form a tungsten nitride layer 3e.

Then, as is shown in FIG. 1(c), on the tungsten film 3b, an aluminum alloy film 3c (with a thickness of approximately 200 nm) including silicon (approximately 1%) and copper (approximately 0.5%) is deposited by the sputtering method. On the aluminum alloy film 3c, a titanium nitride film 3d (with a thickness of approximately 40 nm) is deposited so as to ease the formation of an interconnection pattern in the subsequent photolithography. The aluminum alloy film 3c functions to decrease the interconnection resistance, and the titanium nitride film 3d functions to decrease the reflectance thereof at a wavelength of exposing light in the photolithography.

Then, as is shown in FIG. 1(d), the titanium/titanium nitride bilayer film 3a, the tungsten film 3b, the aluminum alloy film 3c and the titanium nitride film 3d are made into a desired pattern by the photolithography and dry etching, thereby forming a first metallic interconnection 3.

Next, as is shown in FIG. 1(e), the semiconductor apparatus is placed in annealing equipment 9, so as to be subjected to annealing at a temperature of 450° C. This annealing is conducted, similarly to the conventional production procedures, in order to recover the damage of the groundwork caused by the dry etching and stabilize the interface between the metals. When the metals for the interconnection include aluminum, the annealing is generally conducted at a temperature of approximately 450° C. so as to retain the thermal stability of aluminum.

Figure 2:
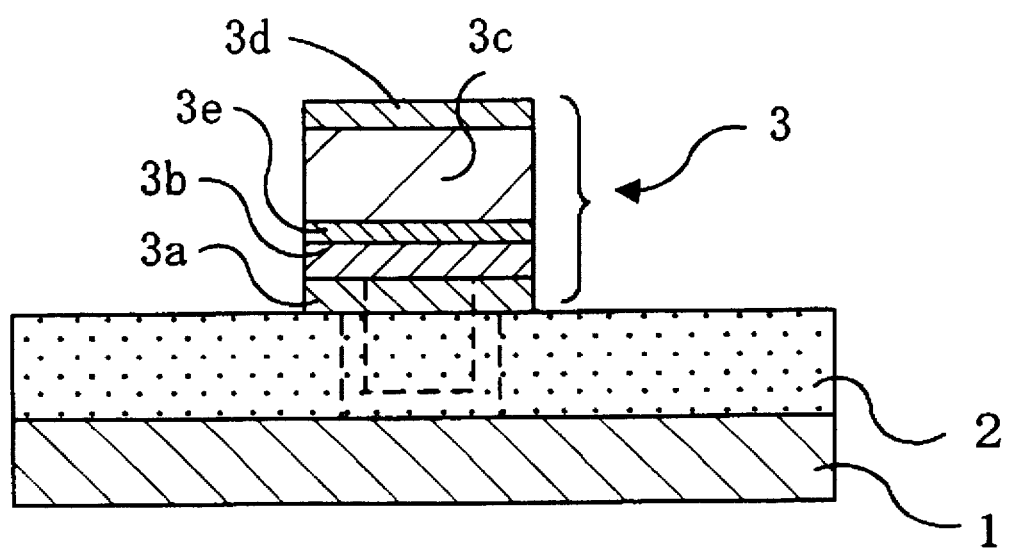
FIG. 2 is a sectional view of the semiconductor apparatus of the first embodiment.

FIG. 2 is a sectional view for showing the configuration of the semiconductor apparatus manufactured by the aforementioned production method. As is shown in FIG. 2, the semiconductor apparatus of this embodiment comprises the silicon substrate 1, and the first insulating film 2, the titanium/titanium nitride bilayer film 3a, the tungsten film 3b, the aluminum alloy film 3c and the titanium nitride film 3d all of which are successively laminated on the silicon substrate 1 in this order. Between the tungsten film 3b and the aluminum alloy film 3c is interposed the tungsten nitride layer 3e formed by subjecting the surface of the tungsten film 3b to the plasma nitridation.

Now, the characteristics of the metallic interconnection 3 of the semiconductor apparatus of this embodiment will be described. It is noted that the following characteristics are attained not only by the semiconductor apparatus of this embodiment but also by other semiconductor apparatuses of the second through fourth embodiments described below.

Figure 8A:
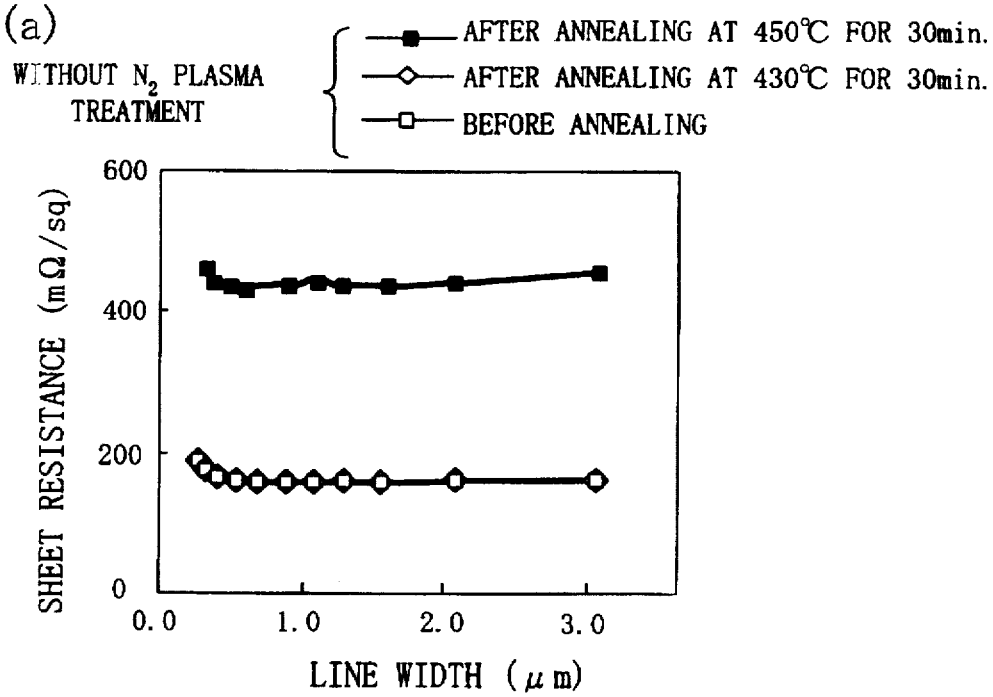
FIGS. 8(a) and 8(b) are characteristic diagrams showing variation in an interconnection resistance against a line width in samples with and without a $N_2$ plasma treatment.
Figure 8B:
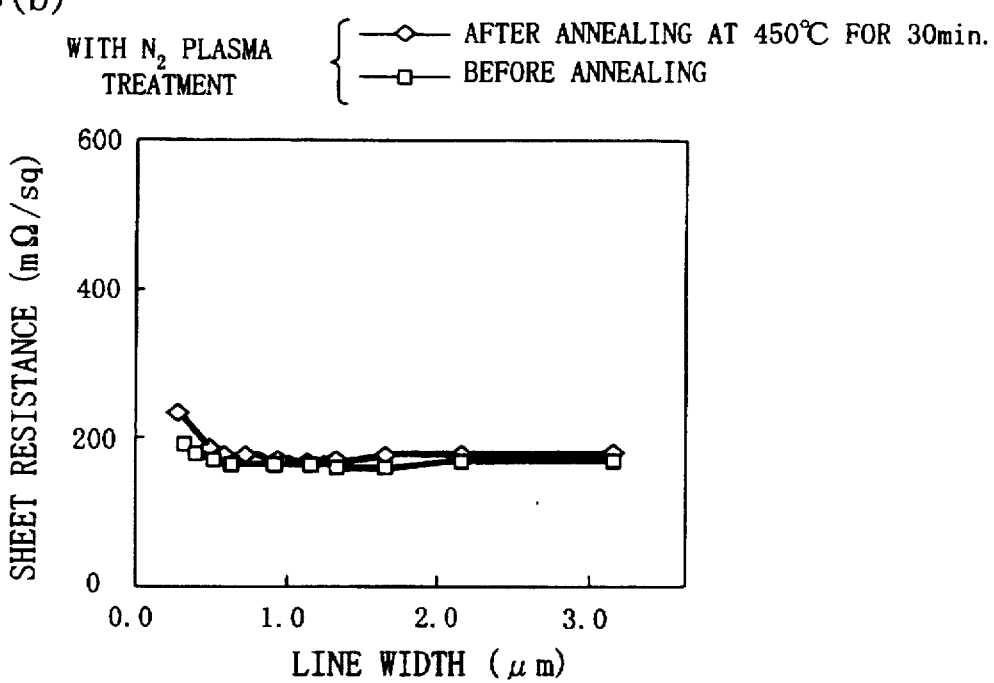

FIGS. 8(a) and 8(b) show the dependency of the sheet resistance value of an interconnection on the width thereof, wherein data shown in FIG. 8(b) are obtained in a sample with the nitridation using $N_2$ plasma (that is, manufactured by exposing the tungsten film 3b to the $N_2$ gas plasma with RF power of 600 W at 50° C. and 80 mTorr for 60 sec.), and those shown in FIG. 8(a) are obtained in a sample without the nitridation using the $N_2$ plasma.

As is shown in FIG. 8(a), before the annealing for the recovery of the damage, there is no difference in the interconnection resistance between the samples with and without the plasma nitridation. With regard to the sample without the plasma nitridation shown in FIG. 8(a), through the annealing for the recovery of the damage and the like at a temperature of 450° C. for 30 minutes, the interconnection resistance is increased by 140 through 180%. However, when the annealing for the recovery of the damage and the like is conducted at a temperature of 430° C. for 30 minutes, the interconnection resistance is little changed.

In contrast, with regard to the sample with the plasma nitridation shown in FIG. 8(b), the increase of the interconnection resistance after the annealing at 450° C. for 30 min. is suppressed to 10% or less.

FIGS. 9(a) and 9(b) show the results of the X-ray analysis in a boundary area between the tungsten film and the aluminum alloy film after the annealing for the recovery of the damage and the like at 450° C.

The following facts can be deduced from the data of the resistance values shown in FIGS. 8(a) and 8(b) and the data of the analysis shown in FIGS. 9(a) and 9(b):

First, by conducting the plasma nitridation on the tungsten film 3b, an alloy layer of $WAl_{12}$ having a high resistance can be effectively prevented from being formed through the annealing at a high temperature for the recovery of the damage and the like.

Secondly, the alloy layer of $WAl_{12}$ having a high resistance is prevented from being formed even without the plasma nitridation as far as the annealing is conducted at a temperature of 430° C. or less.

Thirdly, the plasma nitridation does not increase the interconnection resistance.

Figure 10:
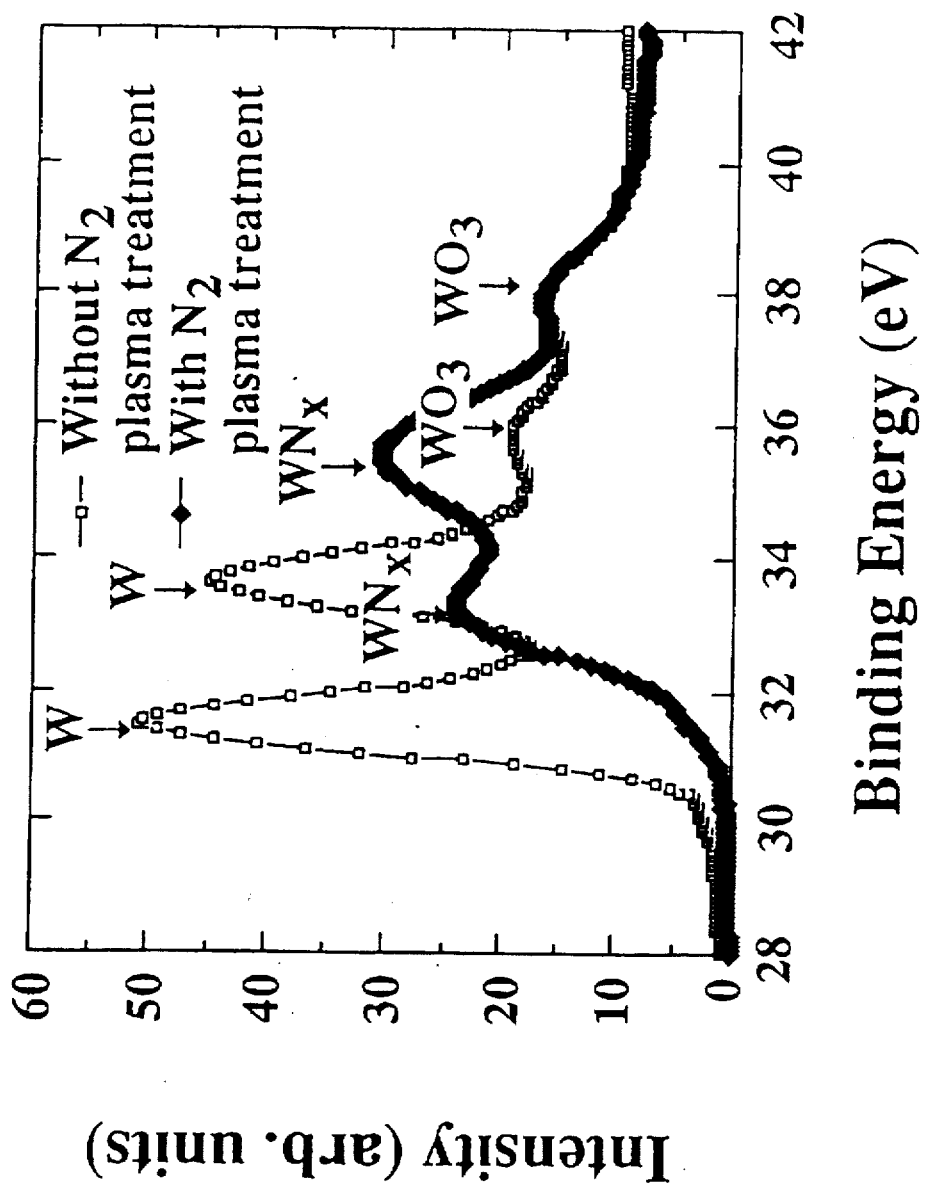
FIG. 10 is a diagram showing the results of an XPS analysis in the area in the vicinity of the surface of the tungsten film in the semiconductor apparatus of the invention.

The plasma nitridation can prevent the formation of the alloy layer of $WAl_{12}$ for the following reason:

FIG. 10 shows data of XPS analysis (X-ray photoelectron spectral analysis) on the surface of the tungsten film having been subjected to the plasma nitridation. The data reveal that a $WN_x$ layer with a thickness of approximately 6 nm is formed on the surface of the tungsten film. Also, the XPS analysis data reveal that the proportion of nitrogen (N) to tungsten (W) in the $WN_x$ layer with this thickness is N/W= 1.59, and hence, it is found that the formed $WN_x$ layer is rich in nitrogen. In addition, since there exists a peak of $WN_x$, it is found that the nitrogen and the tungsten are bonded to each other via their atoms. However, since the $WN_x$ layer has a very small thickness, it has not been found whether the $WN_x$ has a crystal structure or an amorphous structure.

Figure 11:
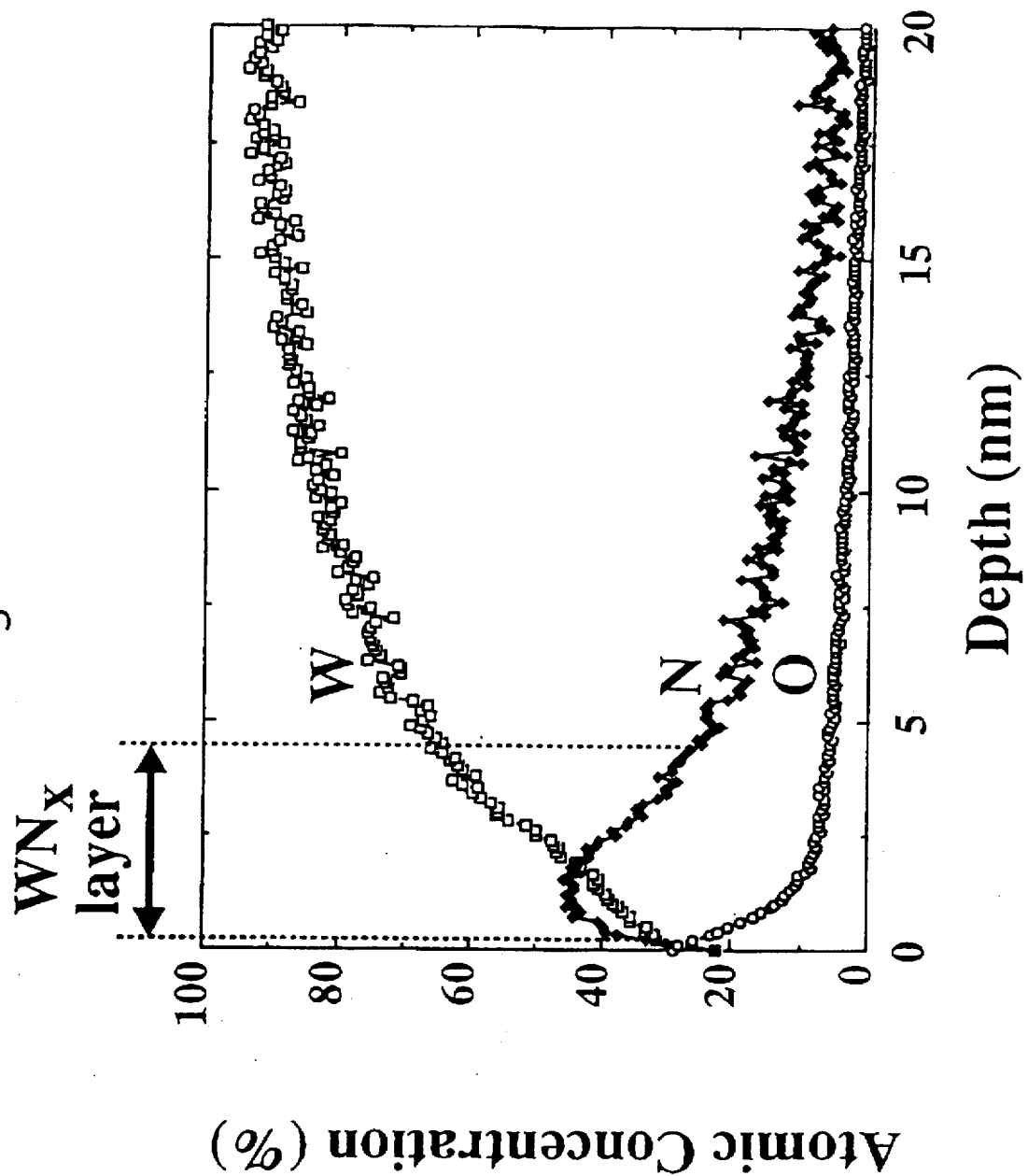
FIG. 11 is a diagram showing the results of an AES depth analysis in the area in the vicinity of the surface of the tungsten film in the semiconductor apparatus of the invention.

FIG. 11 shows data of AES analysis (Auger electron spectral analysis) in a section from the surface to a deeper portion of the tungsten film having been subjected to the plasma nitridation for 60 sec. As is shown in FIG. 11, the thickness of the $WN_x$ layer is approximately 4 through 6 nm. In the $WN_x$ layer with this thickness, the proportion of nitrogen (N) to tungsten (W) at a portion having a maximum nitrogen concentration is N/W=1.1.

Figure 15:
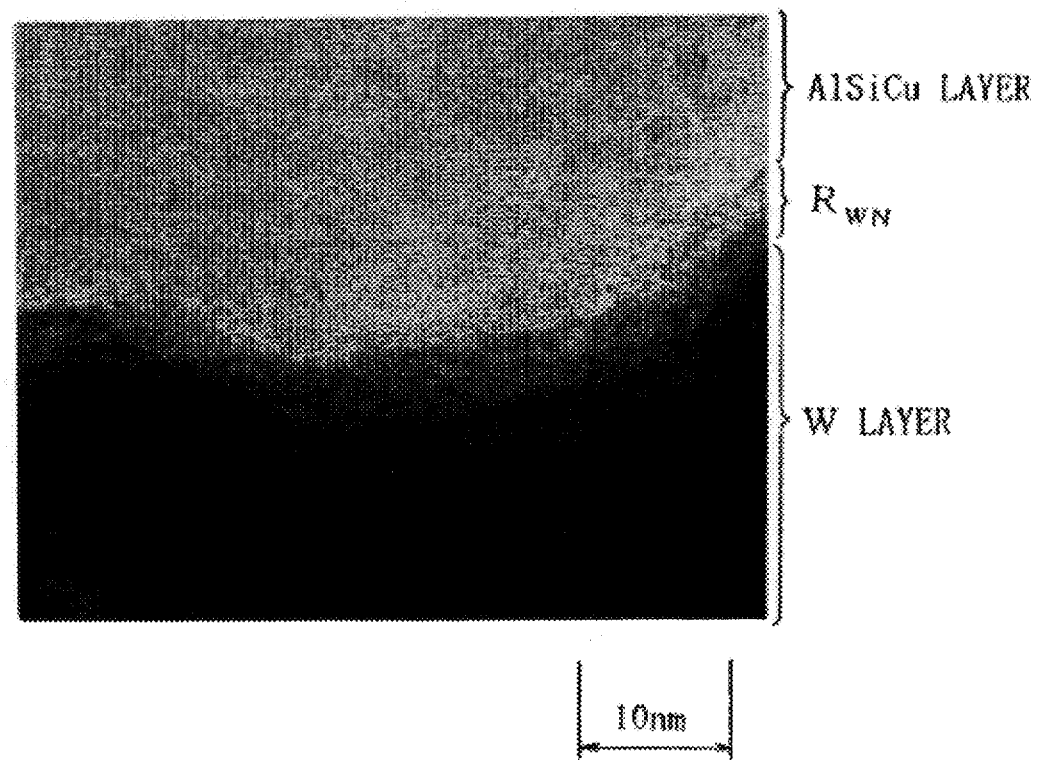
FIG. 15 is a TEM microphotograph of an area in the vicinity of the boundary between a tungsten film and an aluminum alloy film in the semiconductor apparatus of the first embodiment.

FIG. 15 is a TEM microphotograph of a section in the vicinity of the boundary between the tungsten film and the aluminum alloy film in a sample, which has been annealed at a temperature of 450° C. for 30 min. after the aluminum alloy film is deposited on the tungsten film having been subjected to the nitridation using $N_2$ plasma under the aforementioned conditions. In this microphotograph, an area that is assumed to be an amorphous $WN_x$ layer and a fine crystalline $WN_x$ layer (corresponding to an area RWN in FIG. 15) can be found, and this area has a thickness of 1.5 through 2.0 nm. It is impossible to know the state of the sample before the annealing process based on this microphotograph, but it can be considered that the amorphous $WN_x$ layer and the fine crystalline $WN_x$ layer are at least partly present before the annealing process for almost certain. The amorphous $WN_x$ layer does not include a grain boundary, where elements can be easily diffused, differently from a $WN_x$ layer having a crystal structure. Therefore, this amorphous $WN_x$ layer is excellent in the function to prevent the counter diffusion of the composing atoms between the tungsten film and the aluminum alloy film. It is confirmed that this amorphous $WN_x$ layer is formed in a part of the $WN_x$ layer without fail when $x \leq 0.20$, namely, when the content of nitrogen exceeds 20%.

Accordingly, in the semiconductor apparatus of this embodiment, since the tungsten nitride layer 3e serving as a barrier layer is formed on the surface of the tungsten film 3b, the alloy of tungsten and aluminum is prevented from being formed by the counter diffusion of tungsten and aluminum even when the annealing for the recovery of the damage and the like is thereafter conducted. As a result, the resistance is not increased.

Additionally, even though the tungsten nitride layer formed by such plasma nitridation has a very small thickness of several nm, this layer exhibits an excellent barrier function. This is probably because the layer has a structure in which the nitrogen atoms are bonded to the tungsten atoms (see FIG. 10). In contrast, in a tungsten nitride layer formed through nitridation by exposing a tungsten film to $NH_3$ gas at a high temperature, the nitrogen atoms are not bonded to the tungsten atoms but are present merely as interstitial atoms in tungsten crystal. This is probably the reason why such a tungsten nitride layer cannot effectively exhibit a barrier function as is described in Japanese Laid-Open Patent Publication No. 7-231037.

It is, however, considered to be difficult to form the tungsten nitride layer with a small thickness of 20 nm or less by the reactive sputtering method as that described in Japanese Laid-Open Patent Publication No. 7-231037. Therefore, even when the increase of the resistance value due to the formation of the alloy layer of $WAl_{12}$ is suppressed by forming such an anti-reaction film, the resistance value of the interconnection itself can be increased. This is because the resistivity of tungsten nitride W90-N10, W80-N20 and W60-N40 are 100 μΩcm, 200 μΩcm and 350 μΩcm, respectively, which are much higher than the resistivity of tungsten of 9.5 μΩcm (F.C.T. So, et al., J.A.P., 64, 2787-2789, 1988). In contrast, the tungsten nitride layer formed by the plasma nitridation as in this embodiment has a small thickness of several nm, and hence, can advantageously suppress the increase of the resistance value of the interconnection itself.

In particular, the thickness of the tungsten nitride layer is preferably 10 nm or less in view of the suppression of the resistance value of the metallic interconnection.

Furthermore, a tungsten film formed by the CVD has a crystal structure of a column form, and hence has rather rough morphology on its surface. When the surface is thus rough, it is difficult to form a film with a uniform thickness thereon by the reactive sputtering method in which atoms emitted from the upper direction toward the substrate are deposited. The film with an irregular thickness can further increase the resistance value. Particularly when the tungsten nitride film has a small thickness, this problem tends to be caused. In contrast, in the plasma nitridation where the tungsten nitride layer is formed by allowing ions in the plasmatic state around the substrate to enter the tungsten film, the tungsten nitride film can be formed with a substantially uniform thickness even when the tungsten film has a rough surface. Therefore, even the tungsten nitride layer of this embodiment has a small thickness of several nm, it can securely exhibit a barrier function.

Furthermore, in the procedure for the plasma nitridation, it is preferred to apply a radio frequency voltage between a negative electrode and a positive electrode and to position the semiconductor substrate on the negative electrode. Such positioning can increase the ratio of the atomic bond between tungsten and nitrogen. Particularly when a potential difference between the positive electrode and the negative electrode is 100 V or more, the ratio of free atoms can be decreased so as to increase the ratio of the atomic bond between the nitrogen atoms and the tungsten atoms.

It is noted that the method for forming the tungsten film 3b is not limited to the CVD but it can be formed by PVD such as the sputtering method. However, the tungsten film formed by the CVD is better in the step coverage than a tungsten film formed by the sputtering method or the like, and hence, is advantageous when used as a buried layer in a contact hole. In contrast, grains can be generated in the tungsten film formed by the CVD more easily than in the tungsten film formed by the sputtering method, and has rough morphology on the surface because of its crystal structure of columnar form (see FIG. 15). In the case where the surface is rough, it is difficult to form a tungsten nitride film that can securely smooth the irregularity by depositing the tungsten nitride film on the tungsten film by the sputtering method. Additionally, the thickness of the thus formed tungsten nitride film can be locally varied. However, when the nitridation using plasma is adopted as in this embodiment, the tungsten nitride layer can be formed with a substantially uniform thickness from the surface of the tungsten film even when the tungsten film has rough morphology. In other words, by adopting the nitridation using plasma, a tungsten nitride layer that has a small thickness and can securely prevent the counter diffusion of the atoms can be formed between the tungsten film and the aluminum alloy film.

(Embodiment 2)

A production method for a semiconductor apparatus according to the second embodiment will now be described referring to FIGS. 3(a) through 3(e).

Figure 3:
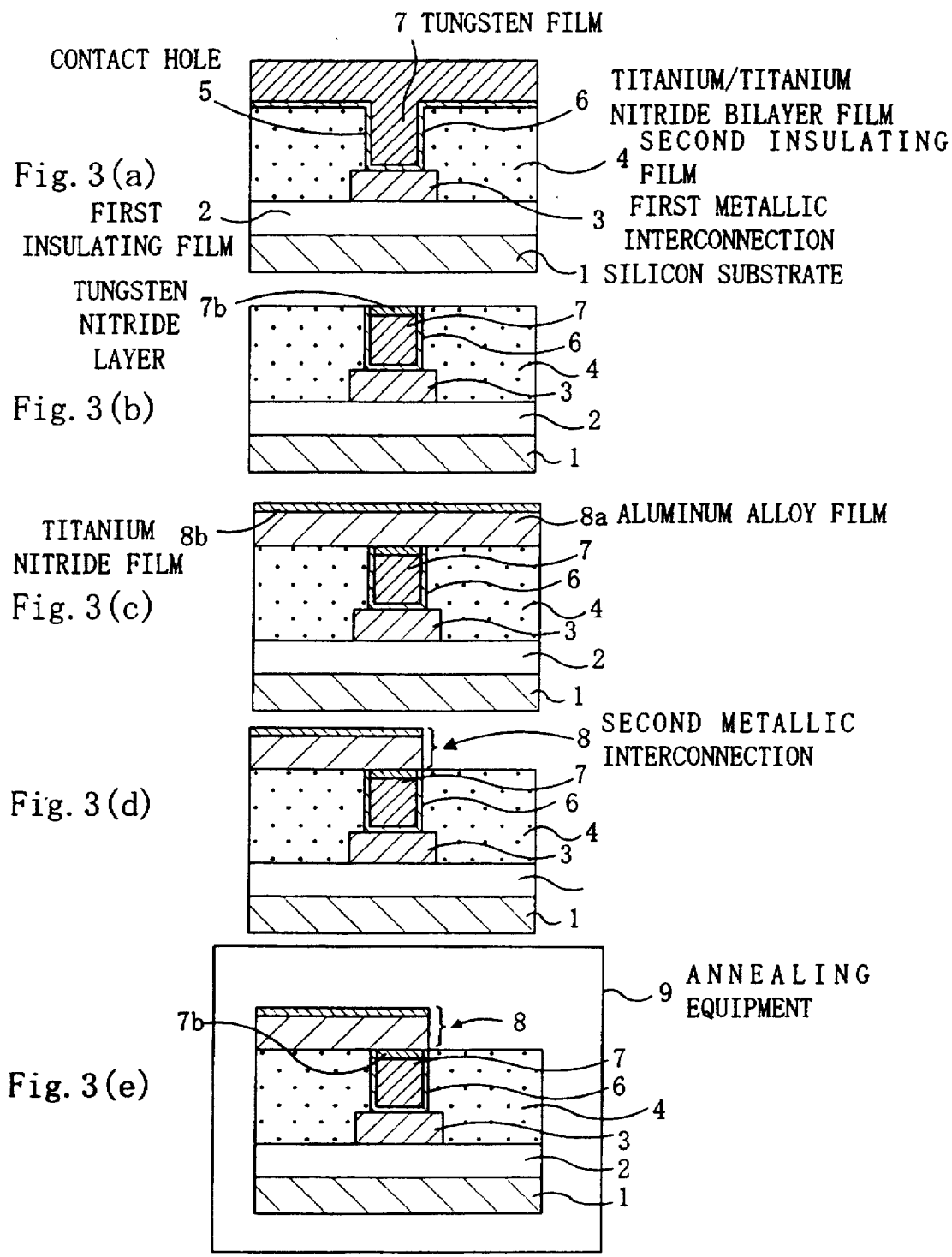
FIGS. 3(a) through 3(e) are sectional views for showing production procedures for a semiconductor apparatus of a second embodiment.

In the procedure shown in FIG. 3(a), a first insulating film 2 and a first metallic interconnection 3 are formed on a silicon substrate 1, on which a semiconductor device such as a transistor is previously formed. On the first metallic interconnection 3, a second insulating film 4 of a silicon oxide film is formed by, for example, the plasma CVD. Then, a contact hole 5 is formed at a predetermined position on the second insulating film 4 by the dry etching so as to reach the first metallic interconnection 3.

Next, a bilayer film 6 including a titanium film (with a thickness of approximately 10 nm) and a titanium nitride film (with a thickness of approximately 30 nm) serving as an adhesion layer for tungsten is deposited within the contact hole 5 and on the second insulating film 4 by the sputtering method. On the titanium/titanium nitride bilayer film 6, a tungsten film 7 with a thickness of approximately 200 nm is deposited by the blanket tungsten CVD. The thicknesses of the films 6 and 7 depend upon the depth and the diameter (approximately 300 nm in this embodiment) of the contact hole 5.

Then, as is shown in FIG. 3(b), the tungsten film 7 and the titanium/titanium nitride bilayer film 6 on the second insulating film 4 are etched back by the dry etching, so as to have the tungsten film 7 and the titanium/titanium nitride bilayer film 6 remained merely within the contact hole 5. Then, the surface of the tungsten film 7 is exposed to plasma with high frequency power of 300 W at a temperature of 50° C. in an atmosphere of 100% nitrogen gas at a pressure of 80 mTorr for one minute, thereby nitriding an area in the vicinity of the surface of the tungsten film 7 so as to form a tungsten nitride layer 7b.

Next, as is shown in FIG. 3(c), an aluminum alloy film 8 (with a thickness of approximately 350 nm) including silicon (approximately 1%) and copper (approximately 0.5%) and a titanium nitride film 8b (with a thickness of approximately 40 nm) are successively deposited on the tungsten film 7 by the sputtering method. The aluminum alloy film 8a functions to decrease the interconnection resistance, and the titanium nitride film 8b functions to decrease the reflectance thereof at a wavelength of exposing light in photolithography.

Then, as is shown in FIG. 3(d), the aluminum alloy film 8a and the titanium nitride film 8b are made into a desired pattern by the photolithography and the dry etching, thereby forming a second metallic interconnection 8.

Then, as is shown in FIG. 3(e), the semiconductor apparatus is placed in annealing equipment 9, so as to be subjected to annealing at a temperature of 450° C. for the recovery of the damage and the like.

In this embodiment, since the tungsten nitride layer 7b is formed in the area in the vicinity of the surface of the tungsten film 7 in the procedure shown in FIG. 3(b), an alloy layer of tungsten and aluminum is not formed in the annealing process shown in FIG. 3(e). Therefore, the resultant semiconductor apparatus is free from the problem of the resistance increase of a metallic plug in the contact hole 5 through the annealing process. In other words, the semiconductor apparatus of this embodiment can exhibit the same effects as those of the first embodiment.

In this embodiment, the contact hole is formed between the metals for the interconnection (namely, as a via), but the same effect can be attained when the contact hole is formed as a connection between a semiconductor area and a metal for the interconnection.

Furthermore, the blanket tungsten CVD is adopted to form the metallic plug in the contact hole 5 in this embodiment, but it is possible to selectively form the tungsten film 7 within the contact hole 5 alone by the selective tungsten method without depositing the titanium/titanium nitride bilayer film 6 and conducting the etch back.

Figure 4:
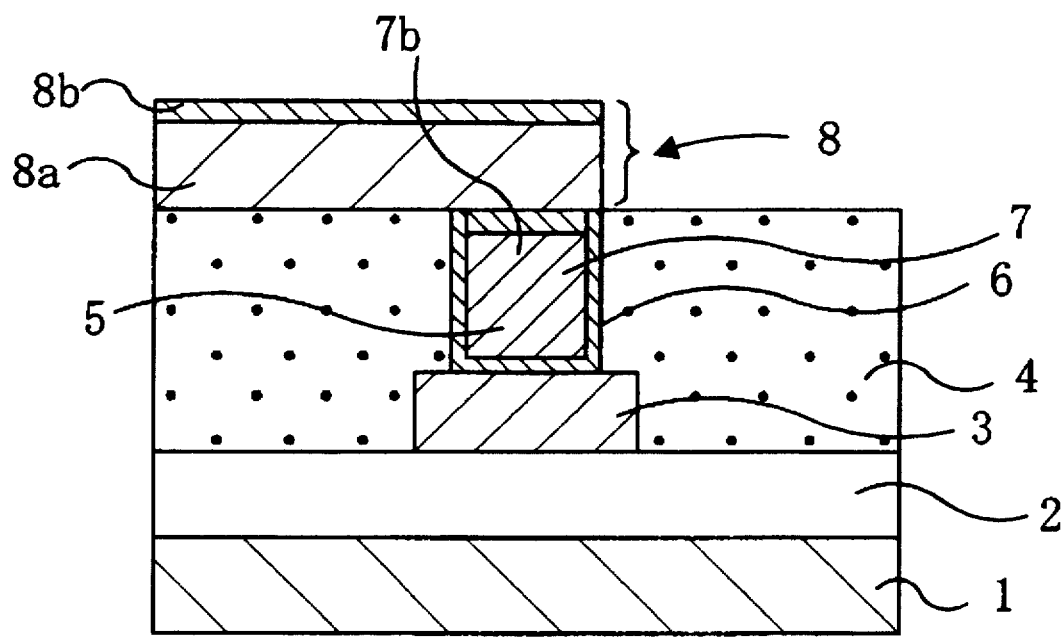
FIG. 4 is a sectional view of the semiconductor apparatus of the second embodiment.

The structure in FIG. 4 shows the semiconductor apparatus manufactured by the aforementioned production method of this embodiment. This semiconductor apparatus comprises the silicon substrate 1, the first insulating film 2, the first metallic interconnection 3 and the second insulating film 4 deposited on the silicon substrate 1, the contact hole 5 formed in a portion of the second insulating film 4, the tungsten film 7, and the titanium/titanium nitride bilayer film 6 as the adhesion layer for the tungsten film 7 both formed within the contact hole 5. The semiconductor apparatus further comprises the tungsten nitride layer 7b formed on the surface of the tungsten film 7 as well as the second metallic interconnection 8 including the aluminum alloy film 8a and the titanium nitride film 8b on the second insulating film 4 and the contact hole 5.

(Embodiment 3)

A production method for a semiconductor apparatus according to the third embodiment will now be described referring to FIGS. 5(a) through 5(e).

Figure 5A:
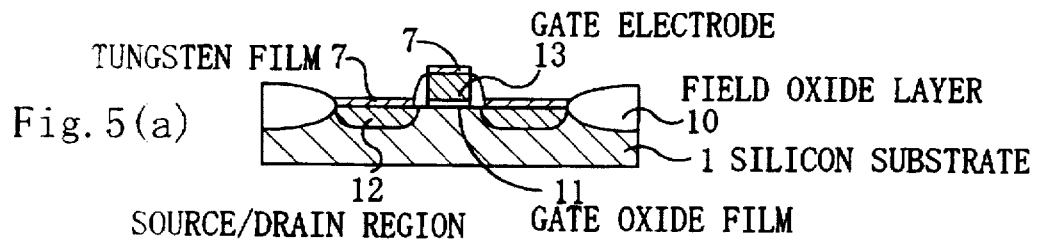
FIGS. 5(a) through 5(e) are sectional views for showing production procedures for a semiconductor apparatus of a third embodiment.

In the procedure shown in FIG. 5(a), a source/drain region 12 and a gate electrode 13 made of polycrystal silicon of a MOS semiconductor apparatus are formed on a silicon substrate 1, and then, a tungsten film 7 is selectively formed on the gate electrode 13 and the source/drain region 12 by the CVD.

Figure 5B:
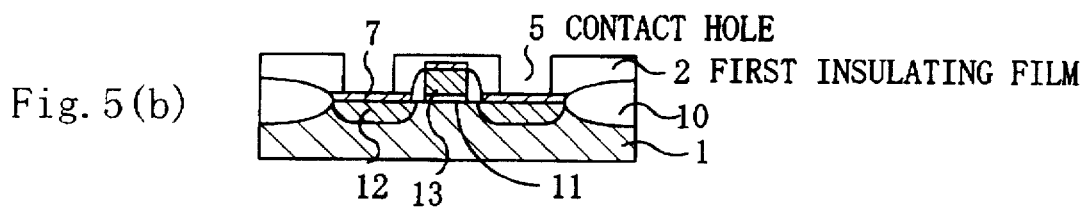

Next, as is shown in FIG. 5(b), a first insulating film 2 is formed on the resultant semiconductor apparatus, and contact holes 5 are formed in the first insulating film 2 so as to reach the gate electrode 13 and the source/drain region 12, respectively. At this point, the surface of the tungsten film 7 is exposed at the bottoms of the contact holes 5. However, in the sectional view of FIG. 5(b), the contact hole reaching the gate electrode 13 is not shown.

Figure 5C:
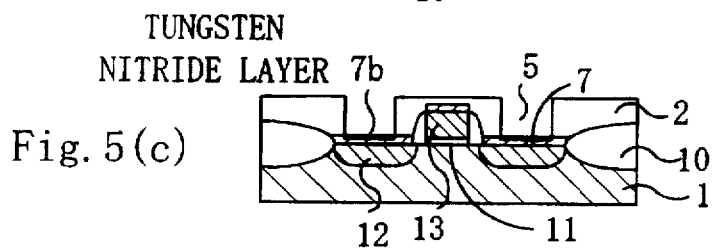

Then, as is shown in FIG. 5(c), the surface of the tungsten film 7 is exposed to plasma with high frequency power of 300 W at a temperature of 50° C. in an atmosphere of 100% nitrogen gas at a pressure of 80 mTorr for one minute, thereby nitriding an area in the vicinity of the surface of the tungsten film 7 so as to form a tungsten nitride layer 7b.

Figure 5D:
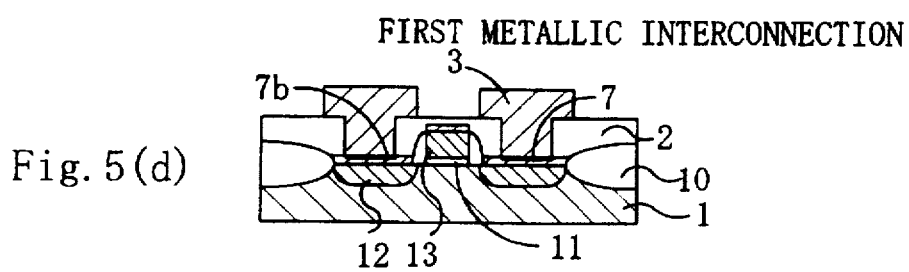

Next, as is shown in FIG. 5(d), an Al alloy film is deposited within the contact holes 5 and on the first insulating film 2 by, for example, sputtering an Al alloy at a temperature of 500° C. The Al alloy film is made into a pattern, thereby forming a first metallic interconnection 3 including a contact portion in each contact hole 5. A temperature of 500° C. or more is generally required for burying an aluminum alloy film in a contact hole.

Figure 5E:
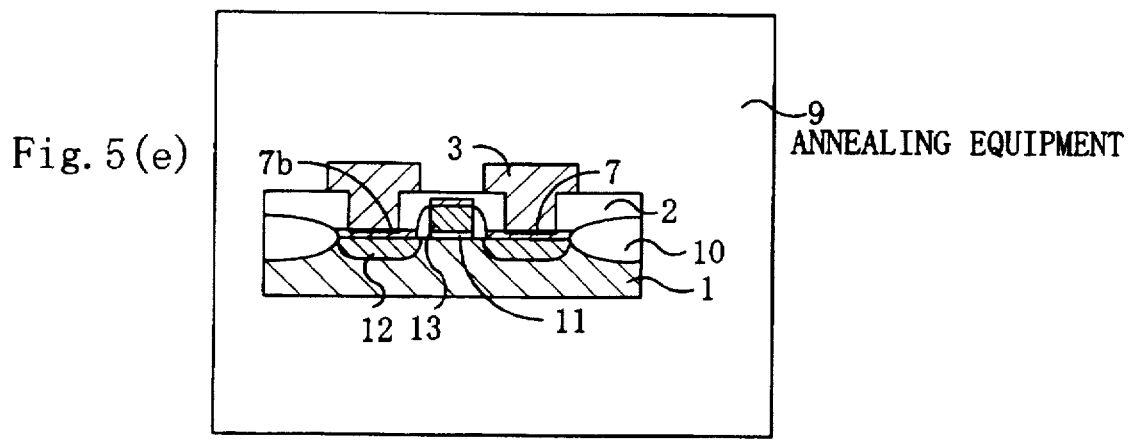

Then, as is shown in FIG. 5(e), the resultant semiconductor apparatus is placed in annealing equipment 9, so as to be subjected to annealing at a temperature of 450° C. for the recovery of the damage and the like in the same manner as in the first and second embodiments.

Since the tungsten nitride layer 7b is formed in the procedure shown in FIG. 5(c) in this embodiment, even through the semiconductor apparatus is exposed to a temperature of 450° C. or more in the high temperature sputtering at 500° C. or more in the procedure shown in FIG. 5(d) and in the annealing process shown in FIG. 5(e), no reaction product is formed out of the tungsten layer 7 and the aluminum alloy in the metallic interconnection 3. Therefore, the resistance of the contact hole 5 does not increase through the annealing, and a junction leakage is not caused in the source/drain region 12. In this manner, the semiconductor apparatus of this embodiment can exhibit the same effects as those of the first and second embodiments.

Figure 6:
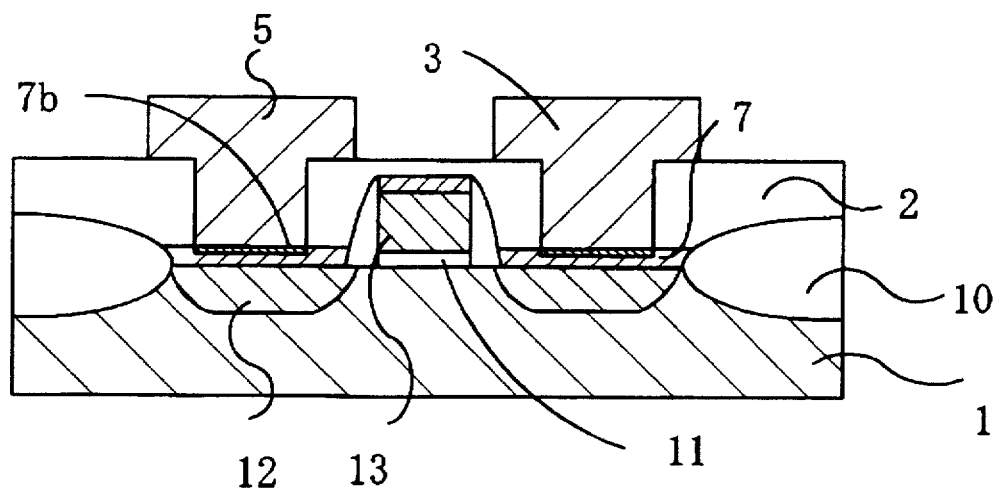
FIG. 6 is a sectional view of the semiconductor apparatus of the third embodiment.

FIG. 6 is a sectional view for showing the structure of the semiconductor apparatus manufactured by the aforementioned production method of this embodiment. As is shown in FIG. 6, the MOS semiconductor apparatus including a field oxide film 10, a gate oxide film 11, the source/drain region 12 and the gate electrode 13 of polycrystal silicon is formed on the silicon substrate 1. The MOS semiconductor apparatus further includes the tungsten film 7 selectively formed on the source/drain region 12 and the gate electrode 13. Furthermore, the first insulating film 2 is deposited on the entire top surface of the substrate, and the contact holes 5 are formed in the first insulating film 2 so as to reach the source/drain region 12 and the gate electrode 13. However, in the sectional view of FIG. 6, the contact hole reaching the gate electrode 13 is not shown. The tungsten nitride layer 7b is formed merely on the surface of the tungsten film 7 within each contact hole 5. Additionally, on the tungsten nitride layer 7b is disposed the first metallic interconnection 3 composed of a buried portion in the contact hole and an interconnection portion on the buried portion.

Also in this embodiment, the formation of the tungsten nitride layer 7b on the surface of the tungsten film 7 can effectively prevent an alloy layer of $WAl_{12}$ having a high resistance from being formed by the counter diffusion of the tungsten and the aluminum even when the annealing process is subsequently conducted.

In addition, it is possible, in this embodiment, to effectively prevent a junction leakage in the silicon substrate 1 from being caused by aluminum invasion of a PN junction in the source/drain region 12.

(Embodiment 4)

The fourth embodiment will now be described referring to FIG. 7.

A production method for a semiconductor apparatus of this embodiment is almost the same as that shown in FIGS. 5(a) through 5(e), and hence, merely a difference is herein described and the production procedures are not shown. In the production method of this embodiment, the plasma nitridation is conducted in the procedure shown in FIG. 5(a), thereby nitriding an area in the vicinity of the surface of the tungsten film 7 so as to form a tungsten nitride layer. Thereafter, the procedures shown in FIG. 5(b), 5(d) and 5(e) are conducted.

Figure 7:
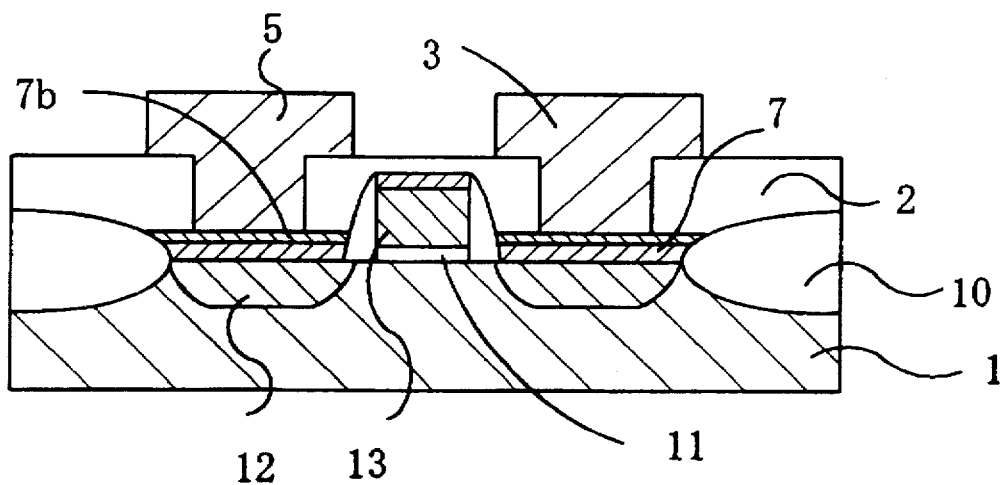
FIG. 7 is a sectional view of a semiconductor apparatus of a fourth embodiment.

FIG. 7 is a sectional view for showing the structure of the semiconductor apparatus of this embodiment. The structure of this semiconductor apparatus is almost the same as that of the third embodiment except that the tungsten nitride layer 7b is formed on the entire surface of the tungsten film 7 in this embodiment, while the tungsten nitride layer is formed on the tungsten film merely within the contact hole in the third embodiment.

Accordingly, the semiconductor apparatus of this embodiment can exhibit the same effects as those of the third embodiment. In addition, since the semiconductor apparatus of this embodiment includes a barrier layer on the entire top surface of the tungsten film 7, aluminum and the like can be more securely prevented from invading the semiconductor substrate below.

(Embodiment 5)

A production method for a semiconductor apparatus according to the fifth embodiment will now be described.

In this embodiment, no tungsten nitride layer is formed on the surface of a tungsten film. Therefore, the production procedures adopted in this embodiment are almost the same as the conventional procedures described referring to FIGS. 12(a) through 12(d), 13(a) through 13(d) or 14(a) through 14(d).

Figure 12A:
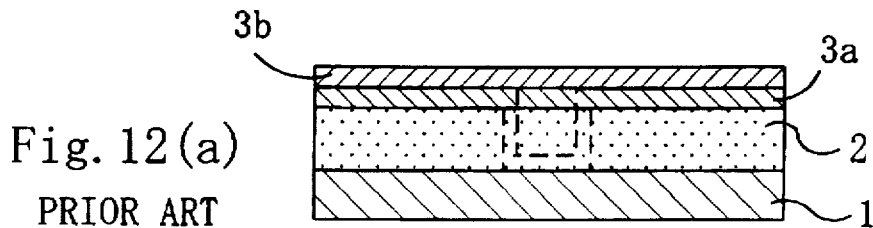
FIGS. 12(a) through 12(d) are sectional views for showing production procedures for a conventional semiconductor apparatus including an Al/W bilayer interconnection.
Figure 12B:
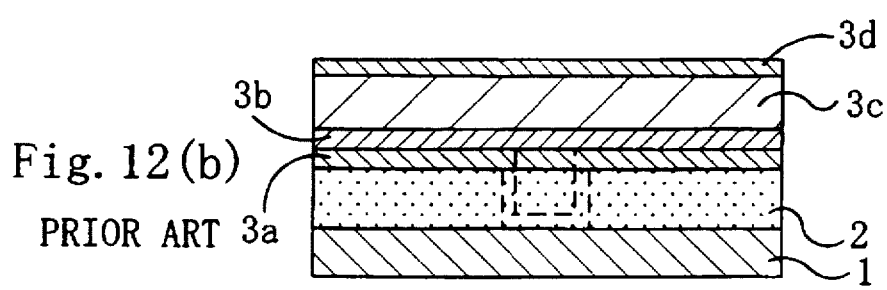
Figure 12C:
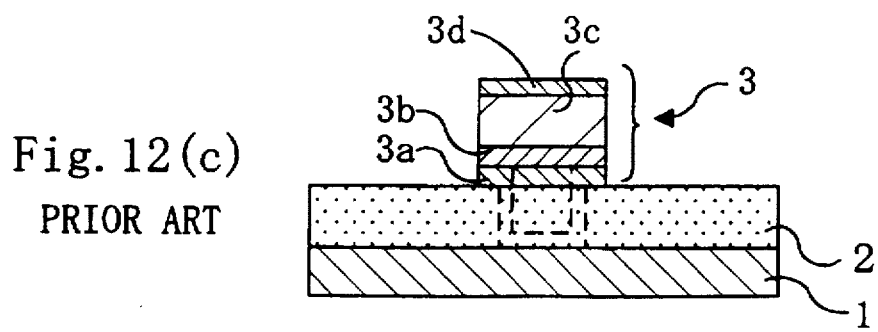
Figure 12D:
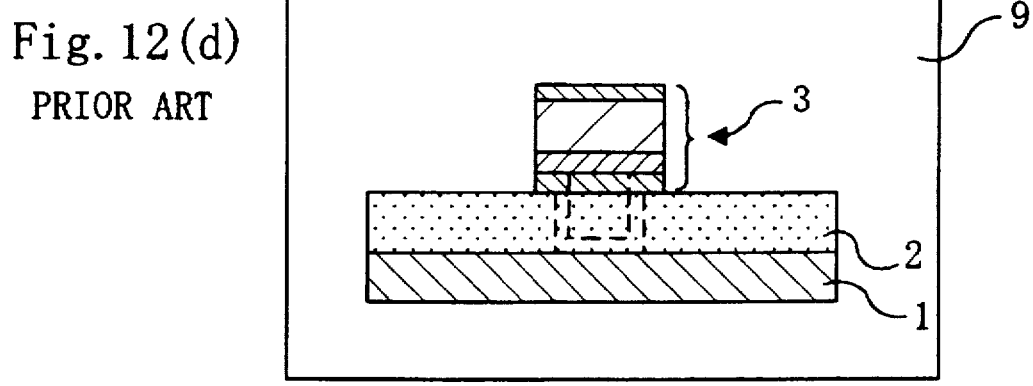
Figure 13A:
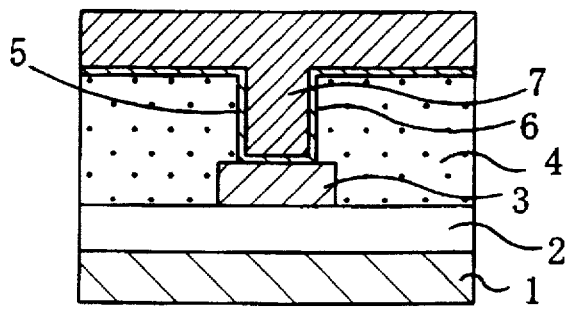
FIGS. 13(a) through 13(d) are sectional views for showing production procedures for another conventional semiconductor apparatus including a buried plug.
Figure 13B:
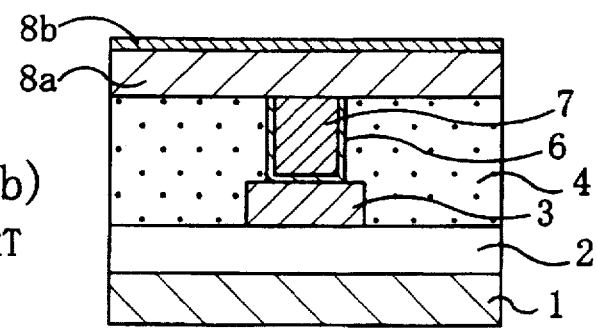
Figure 13C:
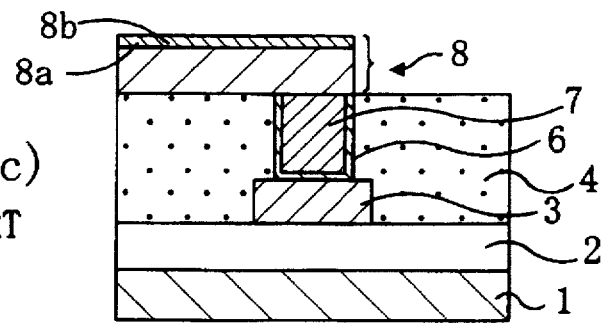
Figure 13D:
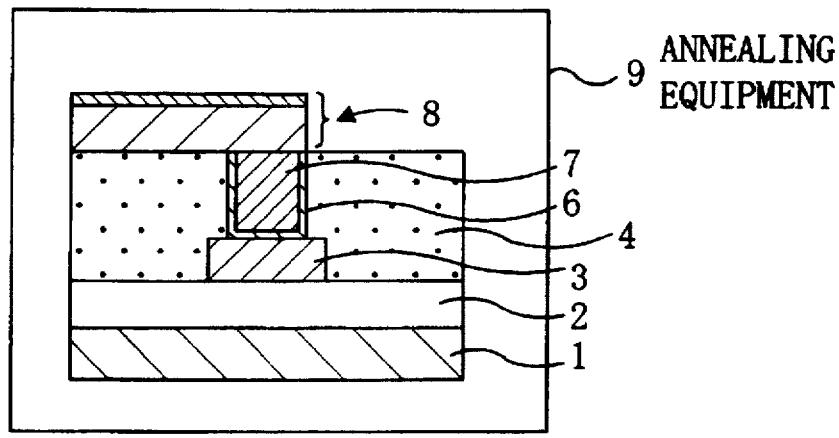
Figure 14A:
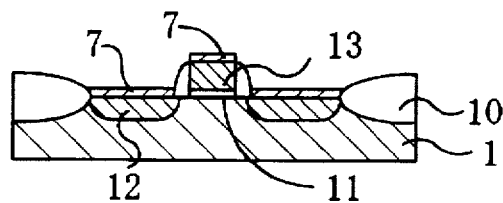
FIGS. 14(a) through 14(d) are sectional views for showing production procedures for a still another conventional semiconductor apparatus utilizing tungsten adhesion technique.
Figure 14B:
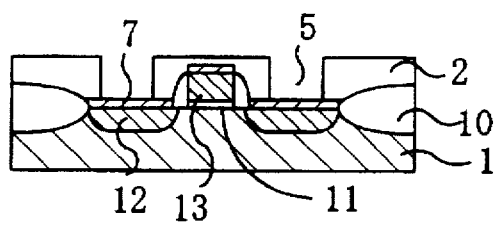
Figure 14C:
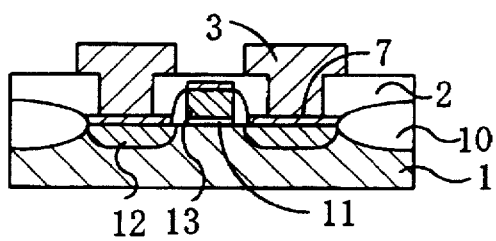
Figure 14D:
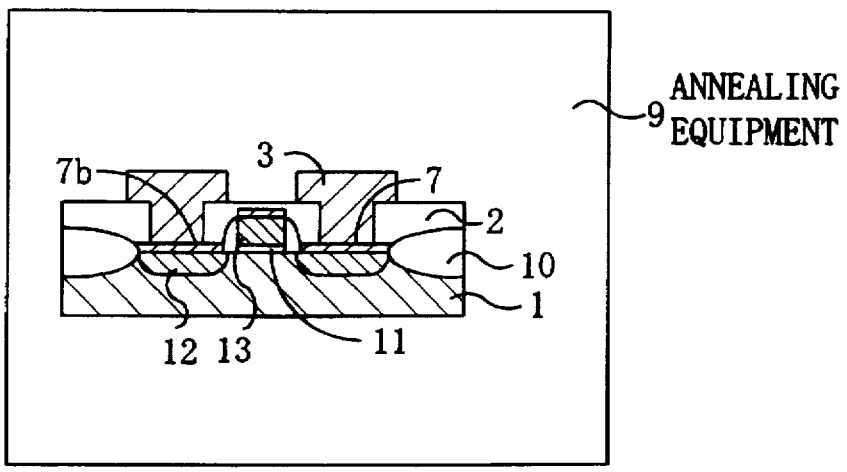

However, although the temperature of the annealing in the annealing equipment 9 is 450° C. in the conventional procedure shown in FIG. 12(d), 13(d) or 14(d), the annealing process is conducted at a temperature ranging between 400° C. and 430° C. in this embodiment.

As described in the first embodiment referring to FIG. 8(a), in the case where the temperature of the annealing for the recovery of the damage and the like is 430° C., the increasing ratio of the resistance value is 10% or less, and no reaction product of the tungsten and the aluminum is formed through the annealing at this temperature. It is found that the recovery of the damage and the like can be securely attained through the annealing at a temperature of 430° C. as far as the treatment time is sufficiently long.

When the temperature of the annealing is lower than 400° C., the damage of the groundwork caused in the dry etching cannot be sufficiently recovered, which results in another problem of the variation in a threshold voltage of a transistor and the like. Therefore, the annealing is conducted preferably at a temperature ranging between 400° C. and 430° C.
(Other embodiments)

Instead of the procedure of exposing the tungsten film to the plasma of the gas including nitrogen in the first through fourth embodiments, a tungsten nitride layer can be formed also in the following manner: The surface of the tungsten film is exposed to a gas including nitrogen atoms and is simultaneously irradiated with UV. Alternatively, the surface of the tungsten film is exposed to an ion beam including nitrogen atoms. Thus, the tungsten nitride layer can be formed on the surface of the tungsten film at a low temperature of 550° C. or less with the help of energy of UV or the ions. Also in such cases, the same effects as those of the aforementioned embodiments can be attained owing to the barrier function of the tungsten nitride layer.

In the first through fourth embodiments, the tungsten film 3b and the aluminum alloy film 3c are sandwiched between the titanium/titanium nitride bilayer film 3a and the titanium nitride film 3d. These films 3a and 3d can be replaced with films of other metals or their compounds. Furthermore, the titanium nitride film 8b is formed as an anti-reflection film on the aluminum alloy film 8a, but the titanium nitride film 8b can be replaced with an anti-reflection film made of another material.

In the first through fourth embodiments, the $N_2$ gas is used as the gas including nitrogen used for the plasma treatment, but the $N_2$ gas can be replaced with another gas such as $NH_3$ as far as it includes nitrogen as a composing element in its molecule.

In the first through fourth embodiments, immediately after the formation of the tungsten film in a CVD system, the procedure of exposing the tungsten film to the plasma can be conducted in the same system.

In the first through fourth embodiments, the aluminum alloy film is made of the aluminum alloy including silicon and copper. However, the aluminum alloy film can be made of an aluminum alloy including silicon alone or including another metal such as scandium. Alternatively, the aluminum alloy film can be replaced with a pure aluminum film. The same effects can be attained when such aluminum films are used.

In the first through fourth embodiments, the metallic interconnection can be made of copper or a copper alloy instead of the aluminum alloy.

In the first through fourth embodiments, the tungsten film is nitrided so as to form the tungsten nitride layer. However, the tungsten film can be replaced with another refractory metal film such as a molybdenum film and a titanium film, and in this case, the tungsten nitride layer is replaced with a molybdenum nitride layer or a titanium nitride layer.

What is claimed is:

1. A semiconductor apparatus comprising:

a semiconductor substrate;

a conductive layer formed at a region including a region on the semiconductor substrate and a portion in the vicinity of a top surface of the semiconductor substrate;

a refractory metal film formed on the conductive layers said refractory metal film comprising tungsten as a main component;

a nitrided metal layer formed in an area in the vicinity of a top surface of the refractory metal film so as to have a thickness of 10 nm or less and having a structure in which nitrogen atoms and refractory metal atoms are bonded; and a metallic interconnection formed in the refractory metal film with the nitrided metal layer interposed therebetween and made of a metal material reactive with the refractory metal.

2. The semiconductor apparatus of claim 1, wherein the conductive layer is an active area formed by introducing an impurity into the semiconductor substrate, the semiconductor apparatus is further provided with an insulating film formed on the active area and a contact hole formed in a part of the insulating film so as to reach the active area, and the refractory metal film is buried in the contact hole.

3. The semiconductor apparatus of claim 1 further comprising a gate electrode formed on the semiconductor substrate, wherein the conductive layer is a source/drain region formed by introducing an impurity into the semiconductor substrate so as to be positioned on both sides of the gate electrode, and the refractory metal film is formed on the gate electrode and the source/drain region.

4. The semiconductor apparatus of claim 1, wherein a content of nitrogen in a part of the nitrided metal layer is in a range where an amorphous nitrided metal layer is formed in a part of the nitrided metal layer.

5. The semiconductor apparatus of claim 1, wherein a content of nitrogen in a part of the nitrided metal layer is larger than a stoichiometric ratio of the nitrided metal.

6. The semiconductor apparatus of claim 1, wherein the nitrided metal layer is formed so as to have a substantially uniform thickness from a top surface of the refractory metal film.

7. The semiconductor apparatus of claim 1, wherein the nitrided metal layer includes oxygen.

8. The semiconductor apparatus of claim 1, wherein the metallic interconnection is made of a metal material including aluminum.

\* \* \* \* \*

UNITED STATES PATENT AND TRADEMARK OFFICE
CERTIFICATE OF CORRECTION

PATENT NO. : 5,780,908
DATED : July 14, 1998
INVENTOR(S) : Sekiguchi et al.

It is certified that error appears in the above-identified patent and that said Letters Patent is hereby corrected as shown below:

In the claims:

Claim 1, line 16, delete "layers" and insert --layer,--.

In the Title:
Title page, item [54] and column 1, line 2,
Change "TUNGSTEIN" to --TUNGSTEN--.

Signed and Sealed this

Fourteenth Day of March, 2000

Attest:

Attesting Officer

Q. TODD DICKINSON

Commissioner of Patents and Trademarks